(12) United States Patent
Park

(10) Patent No.: US 8,101,453 B2
(45) Date of Patent: Jan. 24, 2012

(54) IMAGE SENSOR AND METHOD FOR FABRICATING THE SAME

(75) Inventor: Jin-Ho Park, Yeongju-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 171 days.

(21) Appl. No.: 12/493,792

(22) Filed: Jun. 29, 2009

(65) Prior Publication Data

US 2009/0321866 A1    Dec. 31, 2009

(30) Foreign Application Priority Data

Jun. 27, 2008    (KR) .................. 10-2008-0061599

(51) Int. Cl.
*H01L 21/00* (2006.01)

(52) U.S. Cl. .................. 438/70; 257/432; 257/E31.127

(58) Field of Classification Search ................ 438/70; 257/432, E31.127
See application file for complete search history.

(56) References Cited

FOREIGN PATENT DOCUMENTS

| JP | 2006-332347 | | 7/2006 |
|---|---|---|---|
| JP | 2006-261247 | * | 9/2006 |
| JP | 2006-332347 | * | 12/2006 |

* cited by examiner

*Primary Examiner* — Bradley K Smith
*Assistant Examiner* — Mohammad T Karimy
(74) *Attorney, Agent, or Firm* — Sherr & Vaughn, PLLC

(57) ABSTRACT

An image sensor of a semiconductor and a method for fabricating the same includes a photodiode; an interlayer dielectric layer formed over the photodiode; a wave guide including an ion implantation layer formed in the interlayer dielectric; a color filter formed over the interlayer dielectric layer; and a micro lens formed over the color filter.

10 Claims, 9 Drawing Sheets

IMAGE SENSOR AND METHOD FOR FABRICATING THE SAME

The present application claims priority under 35 U.S.C. §119 to Korean Patent Application No. 10-2008-0061599, filed on Jun. 27, 2008, which is hereby incorporated by reference in its entirety.

BACKGROUND

An image sensor is a semiconductor device that converts an optical image to an electric signal. Such image sensors may be classified as one of a charge coupled device (CCD) image sensor and a complementary metal oxide semiconductor (CMOS) image sensor.

In accordance with CMOS technology using a control circuit as a peripheral circuit and a signal processing circuit simultaneously, the CMOS image sensor prepares MOS transistors corresponding to the number of unit pixels and sequentially detects outputs of the respective unit pixels through the MOS transistors in a switching manner. The CMOS image sensor may include a photodiode and a plurality of MOS transistors, and converts light, i.e., a visible ray being emitted from the front and the back of an image sensor chip into electric signals, accordingly embodying an image.

A vertical image sensor having a vertical photodiode has been developed and is capable of achieving various colors in one unit pixel, which differs from a typical horizontal image sensor.

FIG. 1 illustrates a CMOS image sensor, which is fabricated as follows.

As illustrated in FIG. 1, at least one photodiode 2 is formed in semiconductor substrate 1. Next, interlayer dielectric 3 having a multilayer structure that includes metal lines is formed on and/or over semiconductor substrate 1 including photodiode 2. Passivation layer 4 is formed by vapor-depositing an oxide or a nitride on and/or over interlayer dielectric 3. At least one color filter is then formed on and/or over passivation layer 4 corresponding to photodiode 2. Lastly, at least one micro lens 7 is formed, which may include a planarization layer at a lower part thereof. Such an image sensor fabricating process includes forming micro lens 7 that focuses light, forming the color filter that discriminates signals of respective colors, for example red, green and blue, and forming photodiode 2 that generates electric signals by collecting electrons generated from the focused light.

Interlayer dielectric 3 of such an image sensor is relatively thicker than an interlayer dielectric of a CCD. The CMOS image sensor has a less pixel pitch owing to such a thickness difference. Therefore, the focusing performance with respect to photodiode 2 is deteriorated more seriously than in the CCD although micro lens 7 in the optimum state is applied. This is because the minimum spot size to achieve the focusing with the optimum-state micro lens 7 is proportional to a focal distance and also related to the numerical aperture (NA). The NA in a pixel of the image sensor corresponds to the pixel pitch while the focal distance corresponds to the thickness of interlayer dielectric 3 that contains the metal lines therein. Accordingly, it is required to reduce the size of the pixel and the thickness of interlayer dielectric 3 in order to obtain a focal spot.

In accordance with the CMOS image sensor structure, however, it is limited to reduce the thickness of interlayer dielectric 3 to the minimum necessary thickness. Meaning, there occurs a limited pixel pitch of about 1.75 μm which has been measured as the minimum limit pitch no more reducible. Furthermore, the structure as illustrated in FIG. 1 is limited to effectively focus the light using only micro lens 7 because of the insufficient focusing performance to photodiode 2. Another micro lens, made of an inorganic material, may be further provided in interlayer dielectric 3 in addition to micro lens 7 disposed at the upper part, to thereby overcome certain limitations. However, this considerably complicates the fabrication processes.

As illustrated in FIG. 2A, as an alternative, wave guide 8 may be further provided to serve as a path of incident light. Such a structure is formed by forming a trench by almost a pixel size at an upper part on and/or over photodiode 2 as deep as the thickness of interlayer dielectric 3. Next, wave guide 8 is formed by filling the trench with a material having greater spin-on-glass or refractivity (refraction coefficient) than interlayer dielectric 3. Therefore, the incident light can be efficiently transmitted to photodiode 2 through wave guide 8. However, etching needs to be performed to produce the wave guide, and thus, may cause damage to plasma by the photodiode, thereby increasing dark current and deteriorating the sensitivity of the image sensor. Also, the fabrication processes are complicated.

SUMMARY

Embodiments relate to an image sensor and a method for fabricating the same which enhances the efficiency appropriate for focusing light to a photodiode by forming a wave guide through ion implantation.

Embodiments relate to an image sensor which reduces interference among adjoining pixels as well as enhancing the focusing efficiency by forming a wave guide through more simple processes than etching.

Embodiments relate to a method for fabricating an image sensor that may include at least one of the following: forming a photodiode on and/or over a semiconductor substrate; and then forming an interlayer dielectric layer containing a plurality of metal lines on and/or over the semiconductor substrate including the photodiode; and then forming a wave guide region guiding light to the photodiode in the interlayer dielectric through at least once of ion implantation; and then forming a color filter on and/or over the interlayer dielectric including the wave guide region; and then forming a planarization layer on and/or over the color filter; and then forming a micro lens on and/or over the planarization layer.

Embodiments relate to a method that may include at least one of the following: forming a photodiode; and then forming a dielectric layer over the photodiode; and then forming a wave guide in the dielectric layer by performing a plurality of ion implantation processes; and then forming a color filter over the dielectric layer including the wave guide; and then forming a micro lens over the color filter. The wave guide may include a first ion implantation layer, a second ion implantation layer and a third ion implantation layer.

Embodiments relate to an image sensor that may include at least one of the following: a photodiode formed on and/or over a semiconductor substrate, an interlayer dielectric layer formed on and/or over the semiconductor substrate, including a plurality of metal lines in a transistor region and an ion implantation layer in the photodiode region to form a wave guide for incident light; a color filter formed on and/or over an uppermost surface of the interlayer dielectric layer, a planarization layer formed on and/or over the color filter; and a micro lens formed on and/or over the planarization layer.

Embodiments relate to an image sensor that may include at least one of the following: a photodiode; an interlayer dielectric layer formed over the photodiode; a wave guide including an ion implantation layer formed in the interlayer dielectric; a color filter formed over the interlayer dielectric layer; and a micro lens formed over the color filter.

In accordance with embodiments, forming the wave guide region may include forming a photoresist pattern on and/or over the interlayer dielectric layer; and then implanting ions of a wave guide material, which is different from the material of the interlayer dielectric layer, in the interlayer dielectric layer at least once using the photoresist pattern; and then removing the photoresist pattern. Annealing may be further performed with respect to the whole surface of the semiconductor substrate to thereby diffuse the implanted wave guide material after the removal of the photoresist pattern.

The wave guide material may comprise a material which is a greater element than the material of the interlayer dielectric layer. Arsenic (As) may be ion-implanted for the material of the wave guide material. The wave guide may be formed of a material having greater refractivity than the interlayer dielectric layer.

The ion implanting may include initially implanting ions of the wave guide material by a first implantation dose using the photoresist pattern; and then implanting ions of the wave guide material by a second implantation dose smaller than the first implantation dose using the photoresist pattern; and then implanting ions of the wave guide material by a third implantation dose smaller than the second implantation dose using the photoresist pattern. The first implantation dose may be a quantity of the wave guide material by which the photodiode is filled to the upper part. The second implantation dose may be about one-third or more of the first implantation dose, and the third implantation dose is about one-third or more of the second ion implantation dose.

Forming the photoresist pattern may be performed in a manner that an open width, i.e., an exposed width of the interlayer dielectric is about 20 to 40% of the width of the photodiode.

In accordance with embodiments, the ion implantation layer may be formed of a material different from the material of the interlayer dielectric. The ion implantation layer may be formed by implanting ions of a material greater than the material of the interlayer dielectric layer. The ion implantation layer may have greater refractivity than the interlayer dielectric. The ion implantation layer may be formed by implanting As ions. The ion implantation layer may include a multilayer structure formed by implanting ions of a material which is a greater element than the material of the interlayer dielectric at least once. The ion implantation layer of the multilayer structure may include a plurality of layers having respectively different ion concentrations according to depths thereof.

DRAWINGS

Example FIGS. 3 to 7 illustrate an image sensor and a method for fabricating the image sensor, in accordance with embodiments.

DESCRIPTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
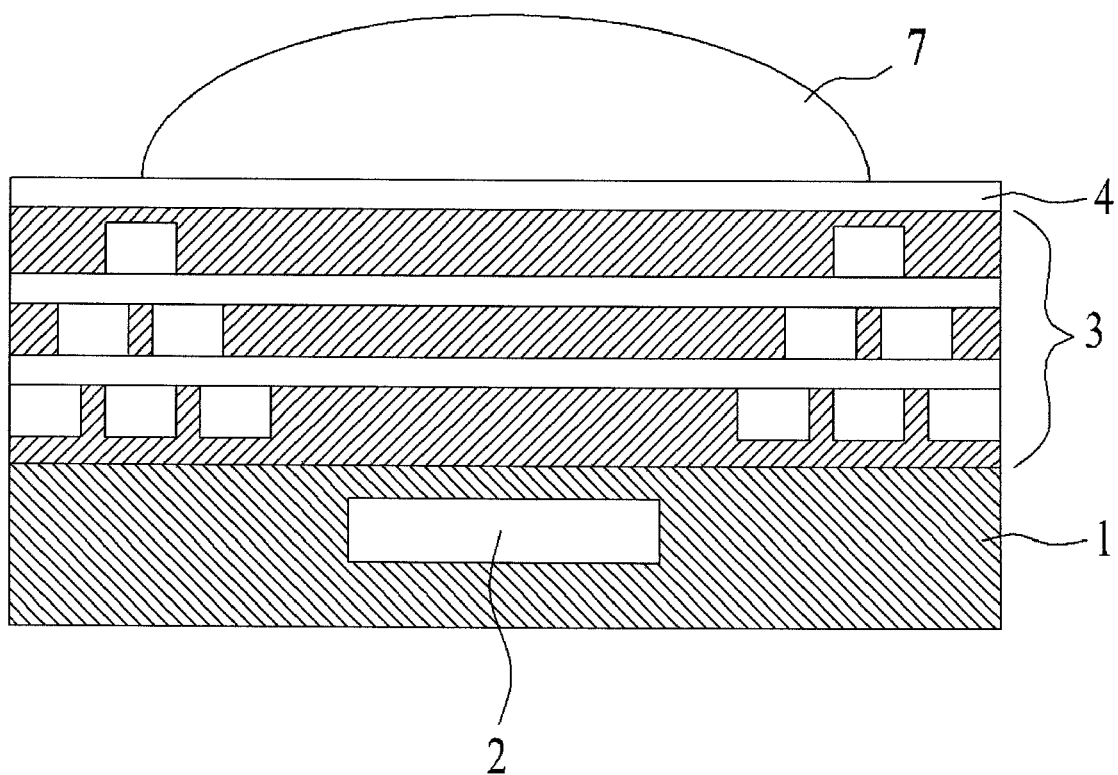
FIG. 1 illustrates a complementary metal oxide semiconductor (CMOS) image sensor.
Figure 2A:
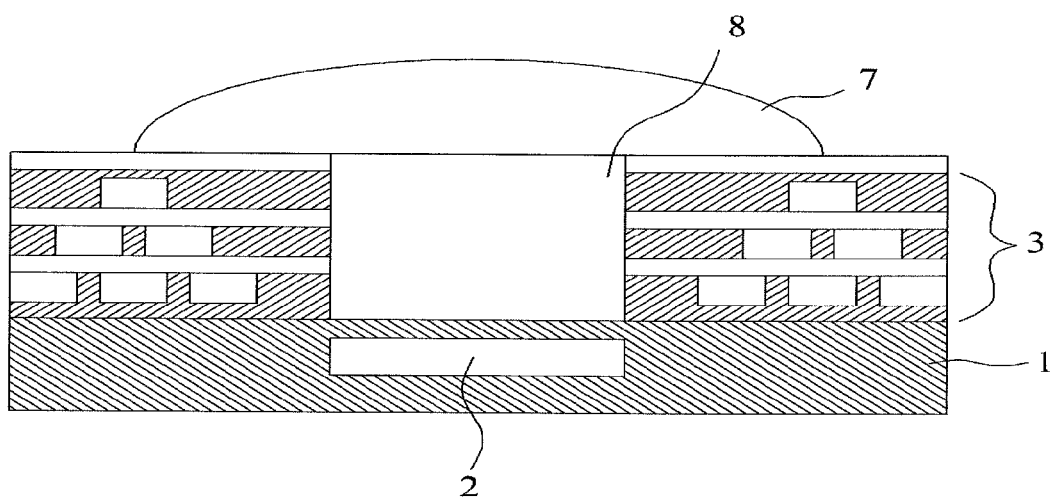
FIGS. 2A and 2B illustrate an image sensor applying a wave guide and light being incident in the image sensor.
Figure 2B:
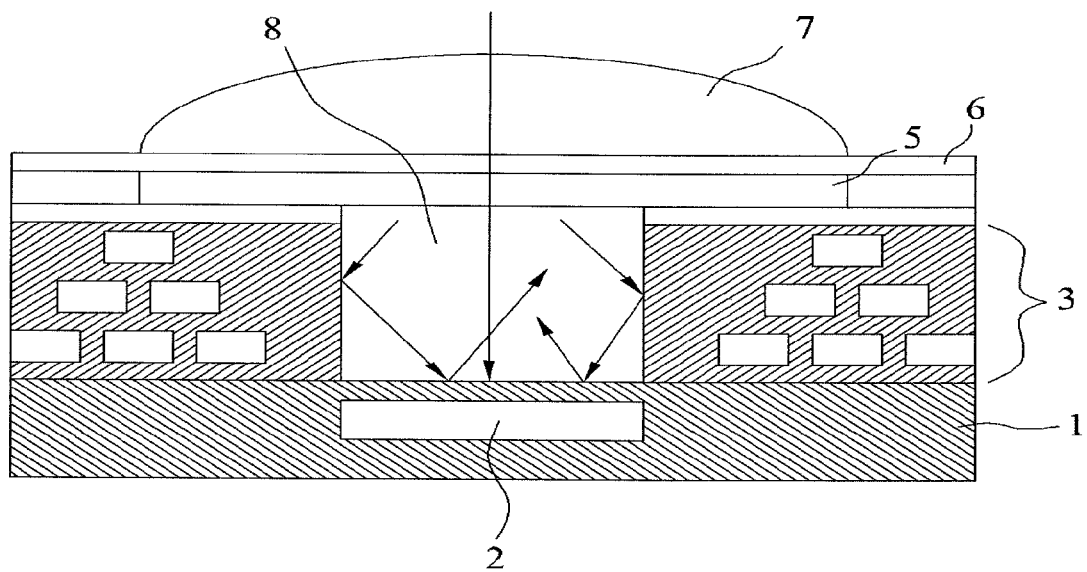
Figure 3:
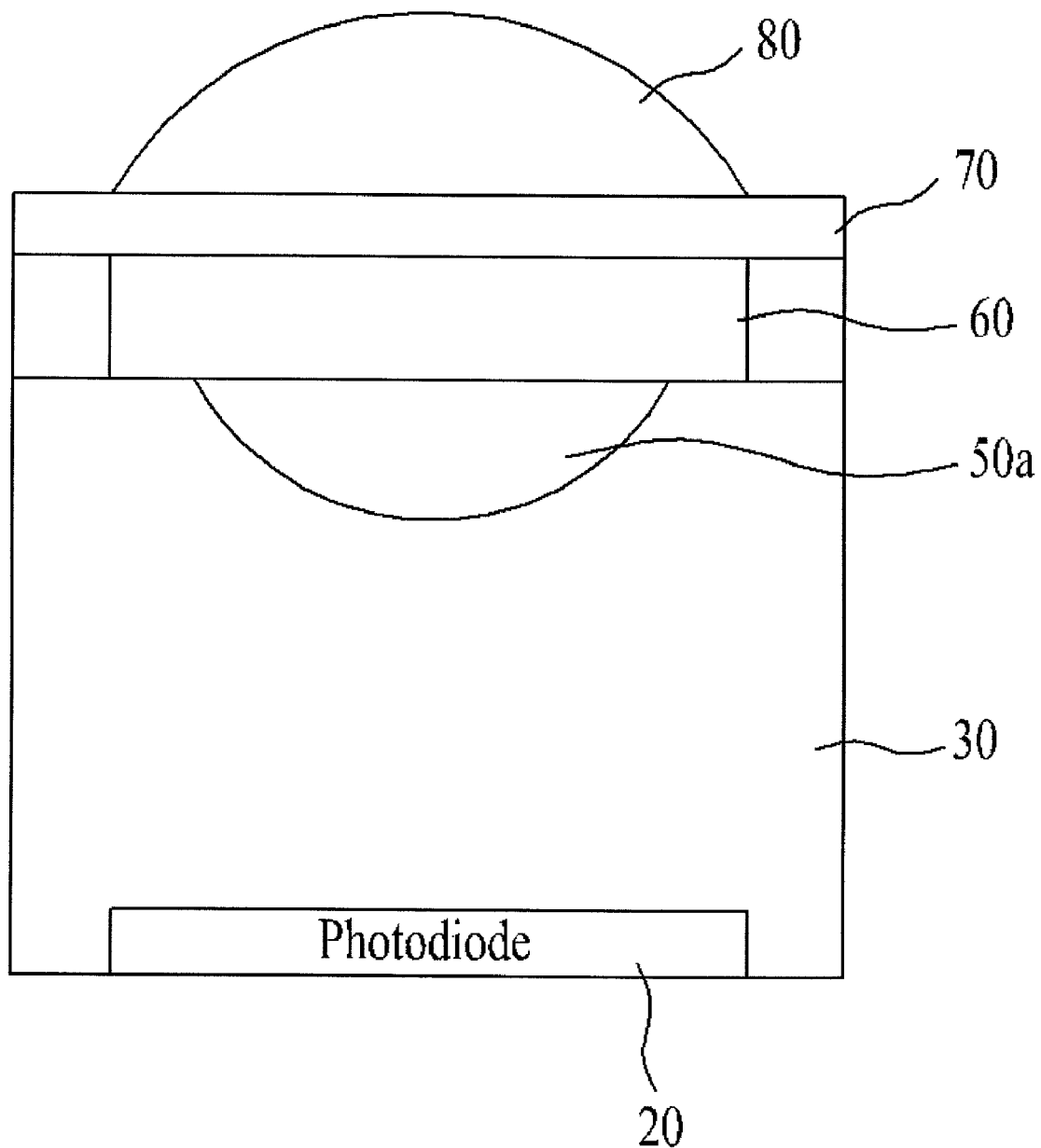

As illustrated in example FIG. 3, an image sensor may take the form of a complementary metal oxide semiconductor (CMOS) sensor having a wave guide which is a path for transmitting incident light. More particularly, the image sensor may include photodiode 20, interlayer dielectric layer 30 having a multilayer structure including an ion implantation layer 50a, a color filter 60, a planarization layer 70, and a micro lens 80.

Photodiode 20 may be formed on and/or over semiconductor substrate 10. Interlayer dielectric 30 is formed on and/or over semiconductor substrate 10 including photodiode 20, and may have a multilayer structure. A plurality of metal lines may be formed in a transistor region of interlayer dielectric 30. Ion implantation layer 50a may be formed in a photodiode region of interlayer dielectric 30 to form the wave guide for the incident light. Ion implantation layer 50a is formed in the photodiode region to correspond to the light path from micro lens 80 to photodiode 20. Color filter 60 is formed on and/or over the uppermost surface of ion implantation layer 50a. Color filter 60 may be formed on the uppermost surface of interlayer dielectric 30 and ion implantation layer 50a. Planarization layer 70 may be formed on and/or over the uppermost surface of color filter 60. Micro lens 80 may be formed on and/or over planarization layer 70 spatially corresponding to color filter 60.

In accordance with embodiments, ion implantation layer 50a may be composed of a material different than the material of interlayer dielectric 30. Ion implantation layer 50a has greater refractivity than interlayer dielectric 30. Ion implantation layer 50a is formed by implanting ions of a material having a greater atomic weight than the material of interlayer dielectric 30. For example, if interlayer dielectric 30 is composed of $Si_xO_y$ (herein, x and y are natural numbers), ion implantation layer 50a may be composed of arsenic (As) which has a greater atomic weight than the oxygen (O). Annealing may be performed on the whole surface of the semiconductor substrate after the implantation of ions to form ion implantation layer 50a, thereby diffusing ion implantation layer 50a.

Example FIG. 4A to FIG. 4D are process sectional views illustrating.

Figure 4A:
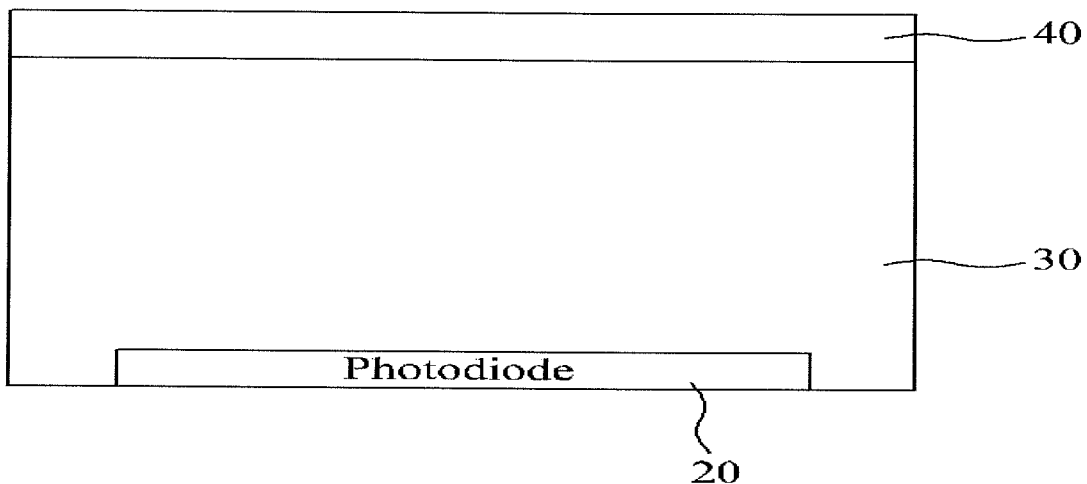

As illustrated in example FIG. 4A, a method of fabricating the image sensor in accordance with embodiments may include forming photodiode 20 on and/or over a semiconductor substrate. Interlayer dielectric 30 containing a plurality of metal lines may then be formed on and/or over semiconductor substrate that includes photodiode 20. A photoresist 40 may then be formed on and/or over interlayer dielectric 30.

Figure 4B:
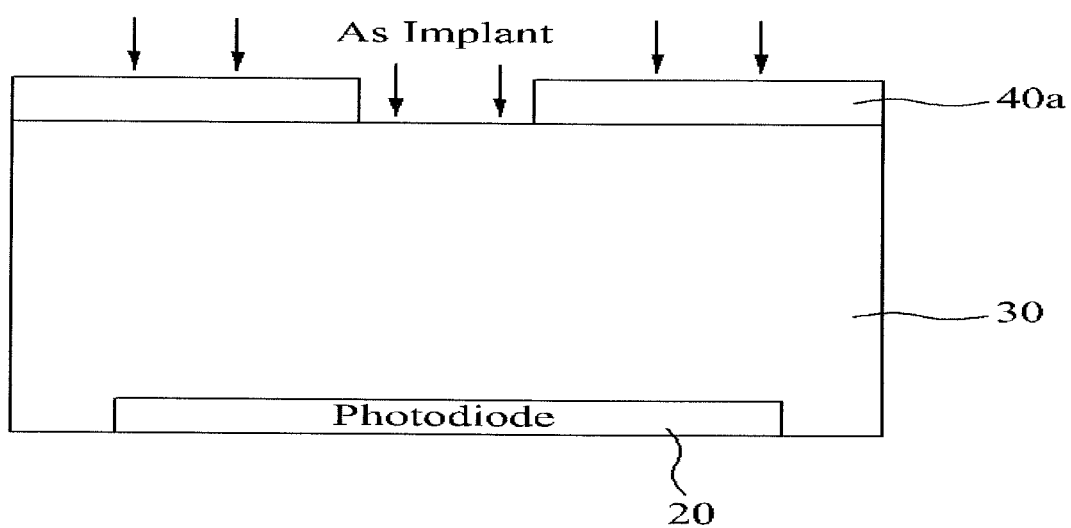

As illustrated in example FIG. 4B, photoresist pattern 40a is formed spaced apart on and/or over interlayer dielectric 30 exposing an uppermost surface of interlayer dielectric 30 in order to conduct an ion implantation process for producing the wave guide which guides light toward photodiode 20. The ion implantation process for forming the wave guide is then performed using photoresist pattern 40a as a mask. Ions from a material different than the material which composes interlayer dielectric 30 are implanted. For example, if interlayer dielectric 30 is composed of $Si_xO_y$ (where x and y are natural numbers), ions of an element such as arsenic (As) which has a greater atomic weight than the oxygen (O) may be implanted into interlayer dielectric 30, thereby forming wave guide material 50.

Figure 4C:
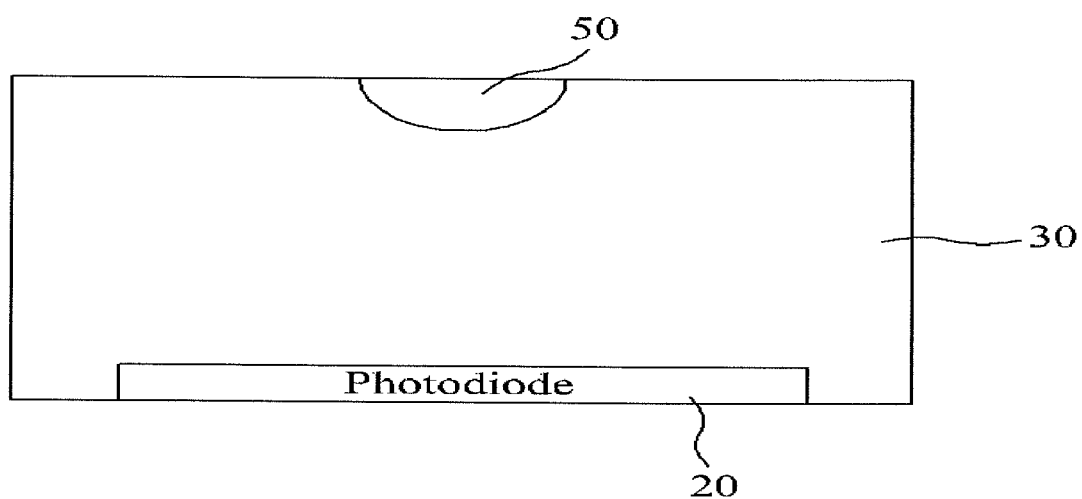

As illustrated in example FIG. 4C, after forming wave guide material 50 in interlayer dielectric 30, photoresist pattern 40a used for the ion implantation is removed.

Figure 4D:
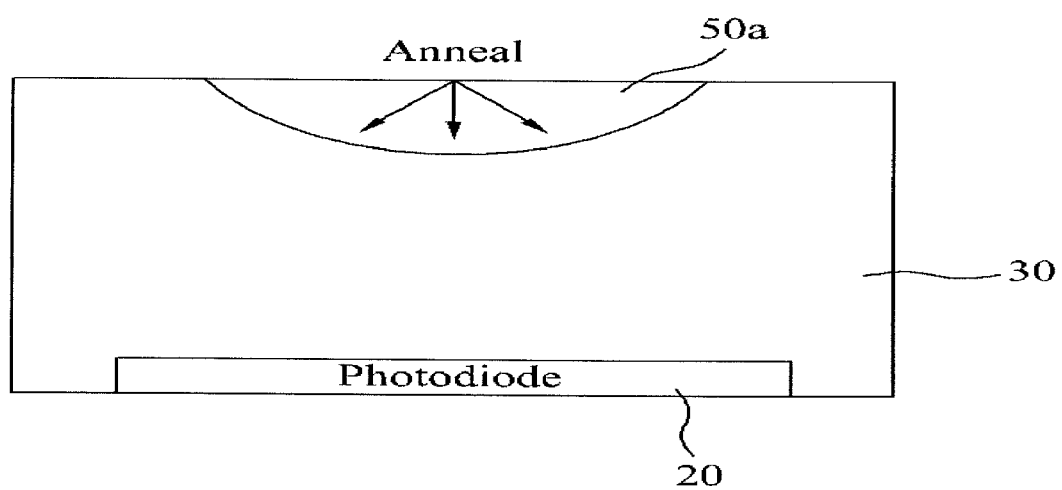

As illustrated in example FIG. 4D, after removal of photoresist patterns 40a, an annealing process is performed on the whole surface of the semiconductor substrate. Accordingly, the implanted wave guide material 50 is diffused, thereby forming ion implantation layer 50a.

Figure 5:
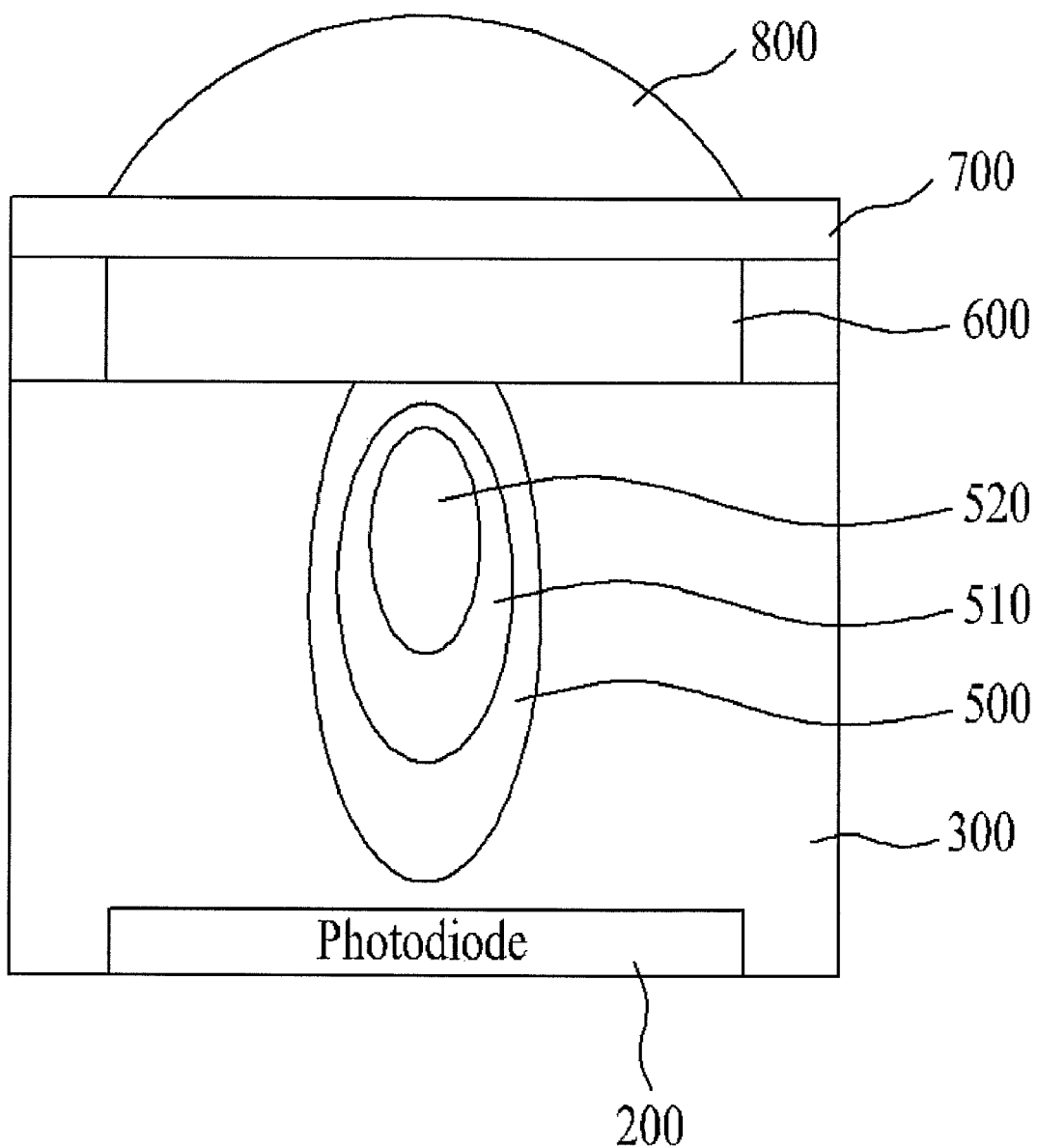

As illustrated in example FIG. 5, an image sensor in accordance with embodiments may a CMOS image sensor having a wave guide as a path for incident light. Such an image sensor may include photodiode 200, interlayer dielectric 300 having a multilayer structure including a plurality of ion implantation layers 500, 510 and 520, color filter 600, planarization layer 700 and micro lens 800.

Photodiode 200 is formed on and/or over a semiconductor substrate 100. Interlayer dielectric 300 having a multilayer structure is formed on and/or over semiconductor substrate 100 including photodiode 200. A plurality of metal lines are formed in a transistor region of interlayer dielectric 300 while ion implantation layers 500, 510 and 520 are formed in a photodiode region of interlayer dielectric 300 in order to form the wave guide for the incident light. Ion implantation layers 500, 510 and 520 are formed in the photodiode region and correspond to the light path extending from micro lens 800 to photodiode 200. Color filter 600 is formed on and/or over the upper region of ion implantation layers 500, 510 and 520. Color filter 600 is formed on and/or over the uppermost surface of interlayer dielectric 300 including ion implantation layers 500, 510 and 520. Planarization layer 700 is formed on and/or over the upper region of color filter 600. Micro lens 800 is formed on and/or over planarization layer 700 and spatially corresponds to color filter 600.

In accordance with embodiments, ion implantation layers 500, 510 and 520 are composed of a material different than the material which composes interlayer dielectric 300 and are formed to have greater refractivity than interlayer dielectric 300. Ion implantation layers 500, 510 and 520 are formed by implanting ions of a material having a greater atomic weight than the material of interlayer dielectric 300. For example, if interlayer dielectric 300 is composed of $Si_xO_y$ (where x and y are natural numbers), ion implantation layers 500, 510 and 520 may be formed of As. Ion implantation layers 500, 510 and 520 may be formed by performing several separate ion implantation processes with respect to interlayer dielectric 300. Accordingly, ion implantation layers 500, 510 and 520 are generated in the form of multiple layers at varying depths within interlayer dielectric 300 and at different ion concentrations. Ion implantation layers 500, 510 and 520 include first ion implantation layer 500 generated by performing a first ion implantation process, second ion implantation layer 510 generated by performing a second ion implantation process, and third ion implantation layer 520 generated by performing a third ion implantation process.

Figure 7:
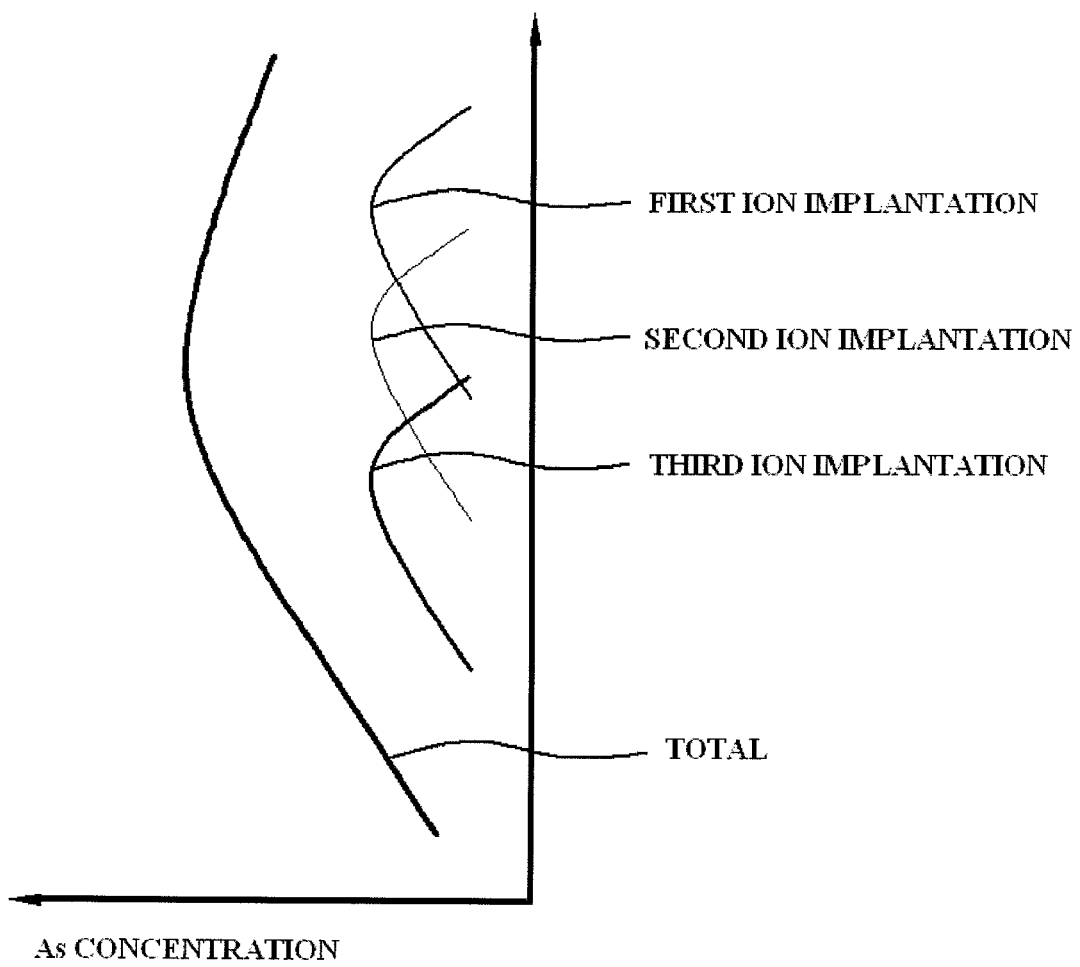

Example FIG. 7 is a graph illustrating the variation of As concentrations in accordance with the depths of ion implantation layers 500, 510 and 520 employed in the image sensor of example FIG. 5. As illustrated in FIG. 7, the As concentration is highest at the medium depth of interlayer dielectric 300. Refractivities in accordance with the depths of ion implantation layers 500, 510 and 520 can be expressed as "$n_3<n_1<n_2$" where $n_3$ refers to refractivity at the deepest position adjacent to photodiode 200, $n_2$ refers to refractivity at the medium-depth position, and $n_1$ refers to refractivity at the shallowest position. For example, annealing may be performed with respect to the whole surface of the semiconductor substrate after formation of the multilayered ion implantation layers 500, 510 and 520, thereby diffusing ion implantation layers 500, 510 and 520.

Figure 6A:
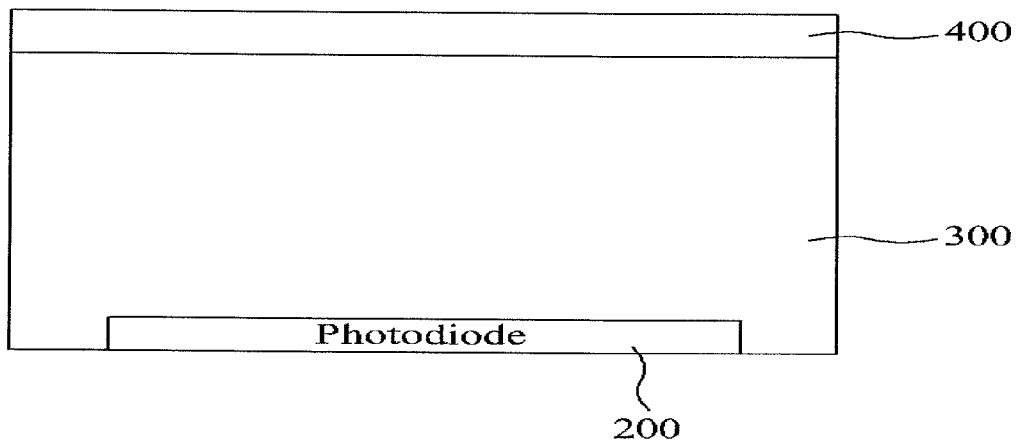

As illustrated in example FIG. 6A, a method of fabricating an image sensor in accordance with embodiments may include forming photodiode 200 on and/or over a semiconductor substrate. Interlayer dielectric 300 including a plurality of metal lines may then be formed on and/or over the semiconductor substrate that includes photodiode 200. Photoresist 400 may then be formed on and/or over interlayer dielectric 300.

Figure 6B:
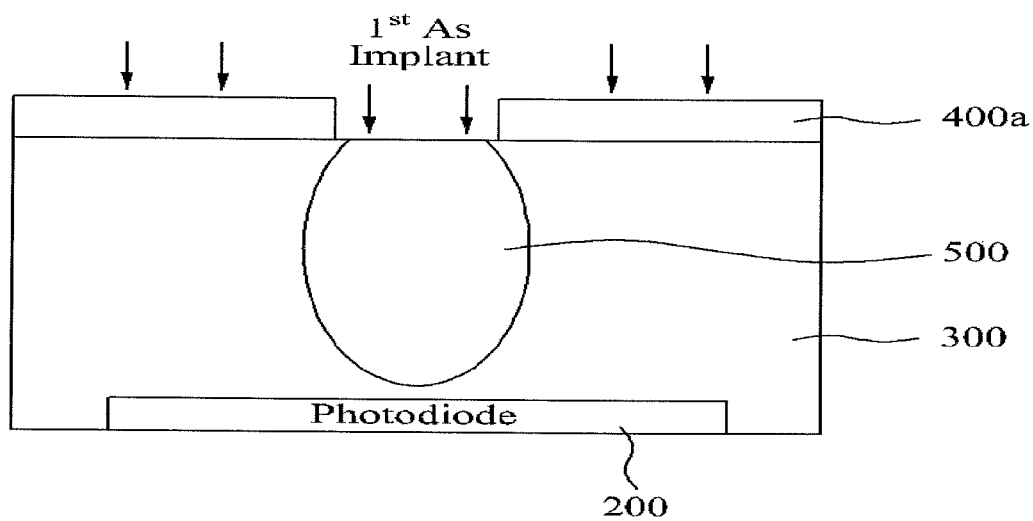

As illustrated in example FIG. 6B, photoresist patterns 400a formed spaced apart on and/or over interlayer dielectric 300 to expose an uppermost surface of interlayer dielectric 300 in order for the ion implantation for producing the wave guide guiding light to photodiode 200. A first ion implantation process for forming first ion implantation layer 500 of the wave guide is performed using photoresist pattern 400a as a mask. During the first ion implantation process, a wave guide material is implanted at a first implantation dosage denoting a quantity of the wave guide material to a level above the upper region of photodiode 200.

Figure 6C:
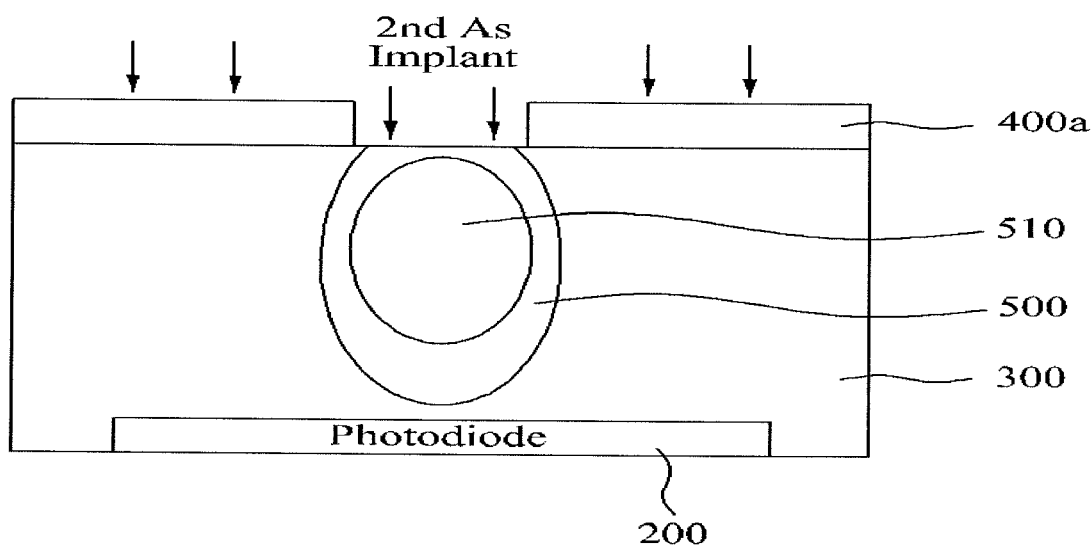

As illustrated in example FIG. 6C, a second ion implantation process for forming second ion implantation layer 510 of the wave guide is performed using photoresist pattern 400a as a mask. During the second ion implantation process, a wave guide material is implanted at a second implantation dosage which is less than the first implantation dosage. For example, the second implantation dosage may be about one-third or more of the first implantation dosage.

Figure 6D:
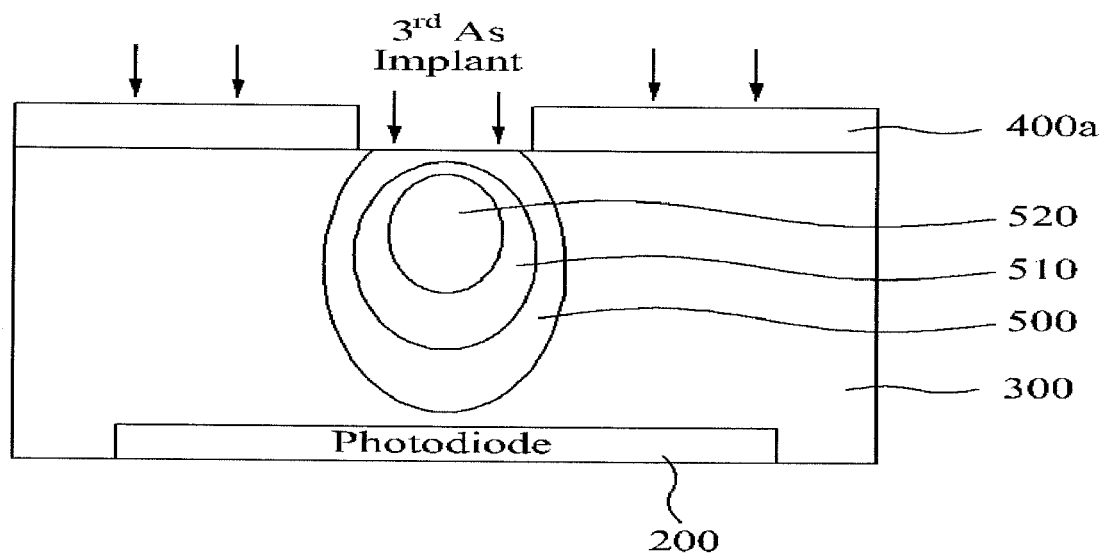

As illustrated in example FIG. 6D, a third ion implantation process for forming third ion implantation layer 520 of the wave guide is performed using photoresist pattern 400a as a mask, thereby completing formation of ion implantation layers 500, 510 and 520. During the third ion implantation process, the wave guide material is implanted at a third implantation dosage, which is less than the second implantation dosage. For example, the third implantation dosage may be about one-third or more of the second implantation dosage.

After performing the third ion implantation process, photoresist pattern 400a is removed. Photoresist pattern 400a used for the ion implantation processes is formed such that the width of the exposed uppermost surface of interlayer dielectric 300 is about 20 to 40% of the overall width of photodiode 200.

In the ion implantation processes, the wave guide material is formed of a material different from the material of interlayer dielectric 300. For example, if interlayer dielectric 300 is formed of $Si_xO_y$ (where x and y are natural numbers), the wave guide material for each of the ion implantation processes may be As, which has a greater atomic weight than the oxygen of interlayer dielectric 300. Ion implantation layers 500, 510 and 520 have greater refractivity than interlayer dielectric 300 as the wave guide effectively guides the light to photodiode 200.

In accordance with embodiments, a wave guide region which is the light transmission path can be formed simply through ion implantation. Since the wave guide region is formed without an etching process required, damage of plasma to the photodiode and an increase in dark current can be prevented.

Also, as the wave guide region is formed simply through ion implantation, the focusing efficiency to the photodiode may be enhanced while also reducing interference among adjoining pixels. Consequently, the photosensitivity of the image sensor can be enhanced to a greater degree.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for fabricating an image sensor comprising:
forming a photodiode over a semiconductor substrate;
forming an interlayer dielectric layer over the semiconductor substrate including the photodiode;
forming a wave guide in the interlayer dielectric layer by performing an ion implantation process;
forming a color filter over the interlayer dielectric layer including the wave guide;
forming a planarization layer over the color filter; and
forming a micro lens over the planarization layer,
wherein forming the wave guide comprises:
forming a photoresist pattern over the interlayer dielectric layer exposing the uppermost surface of the interlayer dielectric layer;
performing the ion implantation process to implant ions of a wave guide material into the interlayer dielectric layer;
removing the photoresist pattern after performing the ion implantation process; and,
performing an annealing process with respect to the semiconductor substrate to thereby diffuse the implanted wave guide material after removing the photoresist pattern,
wherein performing the ion implantation process comprises:
implanting ions of the wave guide material at a first implantation dosage;
implanting ions of the wave guide material at a second implantation dosage smaller than the first implantation dosage; and
implanting ions of the wave guide material at a third implantation dosage smaller than the second implantation dosage.

2. The method of claim 1, wherein the wave guide material is different than a material of the interlayer dielectric layer.

3. The method of claim 1, wherein the first implantation dosage is a quantity of the wave guide material which extends from the uppermost surface of the interlayer dielectric layer to a region above the uppermost surface of the photodiode.

4. The method of claim 1, wherein the second implantation dosage is at least one-third of the first implantation dosage and the third implantation dosage is at least one-third of the second ion implantation dosage.

5. The method of claim 1, wherein the photoresist pattern is formed such that the width of the exposed uppermost surface of the interlayer dielectric layer is 20 to 40% of the overall width of the photodiode.

6. The method of claim 1, wherein the wave guide material comprises a material having a greater atomic weight than the material of the interlayer dielectric layer.

7. The method of claim 1, wherein the wave guide material comprises arsenic.

8. The method of claim 1, wherein the wave guide is formed of a material having greater refractivity than the interlayer dielectric layer.

9. A method comprising:
forming a photodiode; and then
forming a dielectric layer over the photodiode; and then
forming a wave guide in the dielectric layer by performing a plurality of ion implantation processes; and then
forming a color filter over the dielectric layer including the wave guide; and then
forming a micro lens over the color filter,
wherein the wave guide comprises a first ion implantation layer, a second ion implantation layer and a third ion implantation layer,
wherein the first ion implantation layer extends from the uppermost surface of the dielectric layer to a region above the uppermost surface of the photodiode and the color filter is formed over and contacts the first ion implantation layer.

10. A method comprising:
forming a photodiode;
forming a dielectric layer over the photodiode;
forming a wave guide in the dielectric layer by performing a plurality of ion implantation processes;
forming a color filter over the dielectric layer including the wave guide; and
forming a micro lens over the color filter,
wherein the wave guide comprises a first ion implantation layer, a second ion implantation layer and a third ion implantation layer,
wherein the second ion implantation layer is formed in the first ion implantation layer and the third ion implantation layer is formed in the second ion implantation layer.

* * * * *